(12) United States Patent
Lai

(10) Patent No.: US 9,117,526 B2
(45) Date of Patent: Aug. 25, 2015

(54) SUBSTRATE CONNECTION OF THREE DIMENSIONAL NAND FOR IMPROVING ERASE PERFORMANCE

(71) Applicant: Macronix International Co., Ltd., Hsinchu (TW)

(72) Inventor: Erh-Kun Lai, Elmsford, NY (US)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/165,180

(22) Filed: Jan. 27, 2014

(65) Prior Publication Data

US 2015/0009759 A1     Jan. 8, 2015

Related U.S. Application Data

(63) Continuation-in-part of application No. 13/936,729, filed on Jul. 8, 2013.

(51) Int. Cl.
G11C 16/04 (2006.01)
G11C 16/06 (2006.01)

(52) U.S. Cl.
CPC ..................................... G11C 16/06 (2013.01)

(58) Field of Classification Search
USPC ........................... 365/185.17, 185.27, 185.28
See application file for complete search history.

(56) References Cited

U.S. PATENT DOCUMENTS

| | | | |
|---|---|---|---|
| 4,881,114 A | 11/1989 | Mohsen et al. | |
| 5,801,991 A | 9/1998 | Keeney et al. | |
| 5,912,489 A | 6/1999 | Chen et al. | |
| 5,991,193 A | 11/1999 | Gallagher et al. | |
| 6,034,882 A | 3/2000 | Johnson et al. | |
| 6,323,117 B1 | 11/2001 | Noguchi | |
| 6,717,850 B1 * | 4/2004 | Li et al. | 365/185.09 |
| 6,906,361 B2 | 6/2005 | Zhang | |

(Continued)

FOREIGN PATENT DOCUMENTS

| | | |
|---|---|---|
| CN | 1759482 A | 4/2006 |
| EP | 1936681 A1 | 6/2008 |
| EP | 2048709 A2 | 4/2009 |

OTHER PUBLICATIONS

Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012, pp. 91-92.

(Continued)

*Primary Examiner* — Pho M Luu
(74) *Attorney, Agent, or Firm* — Haynes Beffel & Wolfeld LLP

(57) ABSTRACT

A memory includes a doped substrate well, a substrate connector coupled to the doped substrate well, and a set of interlayer connectors insulated from the doped substrate well. A series arrangement including a plurality of memory cells is coupled on a first end by a first switch to a bit line and coupled on a second end by a second switch to a source line contact pad. The source line contact pad is connected to the substrate connector and to at least one of the interlayer connectors in the set of interlayer connectors. A supply line is connected to the set of interlayer connectors. A plurality of word lines is coupled to the plurality of memory cells. Circuitry is coupled to the supply line and to the doped substrate well and configured to bias the supply line and the doped substrate well with different bias conditions.

18 Claims, 13 Drawing Sheets

(56) References Cited

U.S. PATENT DOCUMENTS

| | | | |
|---|---|---|---|
| 6,906,940 B1 | 6/2005 | Lue | |
| 7,005,350 B2 | 2/2006 | Walker et al. | |
| 7,018,783 B2 | 3/2006 | Iwasaki et al. | |
| 7,081,377 B2 | 7/2006 | Cleeves | |
| 7,129,538 B2 | 10/2006 | Lee et al. | |
| 7,177,169 B2 | 2/2007 | Scheuerlein | |
| 7,227,783 B2 | 6/2007 | Li | |
| 7,274,594 B2 | 9/2007 | Pascucci et al. | |
| 7,315,474 B2 | 1/2008 | Lue | |
| 7,369,439 B2 * | 5/2008 | Kamigaichi et al. | 365/185.17 |
| 7,382,647 B1 | 6/2008 | Gopalakrishnan | |
| 7,420,242 B2 | 9/2008 | Lung | |
| 7,433,235 B2 | 10/2008 | Chae et al. | |
| 7,453,729 B2 | 11/2008 | Lee | |
| 7,696,559 B2 | 4/2010 | Arai et al. | |
| 7,851,849 B2 | 12/2010 | Kiyotoshi | |
| 8,258,034 B2 * | 9/2012 | Ramaswamy et al. | 438/287 |
| 8,289,775 B2 | 10/2012 | Lee et al. | |
| 8,343,871 B2 | 1/2013 | Shih et al. | |
| 8,363,476 B2 | 1/2013 | Lue et al. | |
| 8,383,512 B2 | 2/2013 | Chen et al. | |
| 8,467,219 B2 | 6/2013 | Lue | |
| 8,487,422 B2 | 7/2013 | Dunne | |
| 8,503,213 B2 | 8/2013 | Chen et al. | |
| 8,541,882 B2 | 9/2013 | Chen et al. | |
| 8,598,032 B2 | 12/2013 | Chen et al. | |
| 8,659,944 B2 | 2/2014 | Hung et al. | |
| 8,736,069 B2 | 5/2014 | Chiu et al. | |
| 8,743,624 B2 | 6/2014 | Lutze et al. | |
| 8,759,899 B1 | 6/2014 | Lue et al. | |
| 8,760,928 B2 | 6/2014 | Chen et al. | |
| 8,872,256 B2 * | 10/2014 | Lee et al. | 257/326 |
| 2004/0023499 A1 | 2/2004 | Hellig et al. | |
| 2004/0124466 A1 | 7/2004 | Walker et al. | |
| 2004/0188822 A1 | 9/2004 | Hara | |
| 2005/0280061 A1 | 12/2005 | Lee | |
| 2007/0045708 A1 | 3/2007 | Lung | |
| 2007/0090434 A1 | 4/2007 | Davies et al. | |
| 2007/0140001 A1 | 6/2007 | Motoi et al. | |
| 2007/0231750 A1 | 10/2007 | Parikh | |
| 2007/0252201 A1 | 11/2007 | Kito et al. | |
| 2007/0253233 A1 | 11/2007 | Mueller et al. | |
| 2008/0048237 A1 | 2/2008 | Iwata | |
| 2008/0073635 A1 | 3/2008 | Kiyotoshi et al. | |
| 2008/0096327 A1 | 4/2008 | Lee et al. | |
| 2008/0101109 A1 | 5/2008 | Haring-Bolivar et al. | |
| 2008/0106931 A1 | 5/2008 | Toda | |
| 2008/0170429 A1 | 7/2008 | Bertin et al. | |
| 2008/0175032 A1 | 7/2008 | Tanaka et al. | |
| 2008/0180994 A1 | 7/2008 | Katsumata et al. | |
| 2008/0247230 A1 | 10/2008 | Lee et al. | |
| 2008/0285350 A1 | 11/2008 | Yeh | |
| 2009/0001530 A1 | 1/2009 | Goto | |
| 2009/0032966 A1 | 2/2009 | Lee et al. | |
| 2009/0097321 A1 | 4/2009 | Kim et al. | |
| 2009/0184360 A1 | 7/2009 | Jin et al. | |
| 2010/0007001 A1 | 1/2010 | Wang et al. | |
| 2010/0054015 A1 | 3/2010 | Lee et al. | |
| 2010/0109164 A1 | 5/2010 | Kang et al. | |
| 2010/0133645 A1 | 6/2010 | Dunne | |
| 2010/0182041 A1 | 7/2010 | Feng et al. | |
| 2010/0225000 A1 | 9/2010 | Sugizaki et al. | |
| 2010/0226195 A1 | 9/2010 | Lue | |
| 2010/0270593 A1 | 10/2010 | Lung et al. | |
| 2011/0031630 A1 | 2/2011 | Hashimoto | |
| 2011/0057321 A1 | 3/2011 | Wang et al. | |
| 2011/0069524 A1 | 3/2011 | Toba et al. | |
| 2011/0116309 A1 | 5/2011 | Lung | |
| 2011/0235398 A1 | 9/2011 | Hosono | |
| 2011/0235408 A1 | 9/2011 | Minemura et al. | |
| 2011/0292738 A1 * | 12/2011 | Hsu et al. | 365/185.28 |
| 2011/0305088 A1 | 12/2011 | Huang et al. | |
| 2012/0007167 A1 | 1/2012 | Hung et al. | |
| 2012/0051137 A1 | 3/2012 | Hung et al. | |
| 2012/0068241 A1 | 3/2012 | Sakuma et al. | |
| 2012/0119283 A1 | 5/2012 | Lee et al. | |
| 2012/0182802 A1 | 7/2012 | Hung et al. | |
| 2012/0182806 A1 | 7/2012 | Chen et al. | |
| 2012/0281471 A1 | 11/2012 | Hung et al. | |
| 2012/0327714 A1 | 12/2012 | Lue | |
| 2013/0082341 A1 | 4/2013 | Shimizu et al. | |
| 2013/0088920 A1 | 4/2013 | Huang et al. | |
| 2013/0341797 A1 | 12/2013 | Lim | |
| 2014/0053979 A1 | 2/2014 | Chen et al. | |
| 2014/0198576 A1 | 7/2014 | Hung et al. | |

OTHER PUBLICATIONS

Choi et al., "3D approaches for non-volatile memory", 2011 Symposium on VLSI Technology, Digest of Technical Papers, pp. 178-179, Jun. 14-16, 2011.

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.

Choi, et al. "Investigation of Gate-Induced Drain Leakage (GIDL) Current in Thin Body Devices: Single-Gate Ultra-Thin Body, Symmetrical Double-Gate, and Assymmetrical Double-Gate MOSFETs," Jpn. J. Appl. Phys. vol. 42, Apr. 2003, pp. 2073-2076.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hu J. et al., "Reducing Write Activities on Non-volatile Memories in Embedded CMPs via Data Migration and Recomputation," Proc. of the IEEE/ACM DAC, Jun. 13-18, 2010, pp. 350-355.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

Jung et al., "Three Dimensionally Stacked NAND Flash Memory Technology Using Stacking Single Crystal Si Layers on ILD and TANOS Structure for Beyond 30nm Node," IEEE IEDM Dec. 11-13 2006, 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline Stacked Array," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same Plane)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory," Electron Devices Meeting, 2006,

(56) References Cited

OTHER PUBLICATIONS

IEDM '06 International, Dec. 11-13, 2006, pp. 1-4.
Lai et al., "Highly Reliable MA BE-SONOS (Metal-Al2 O3 Bandgap Engineered SONOS) Using a SiO2 Buffer Layer," VLSI Technology, Systems and Applications, 2008, VLSI-TSA 2008 International Symposium on Apr. 21-23, 2008, pp. 58-59.
Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.
Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.
Nowak et al., "Intrinsic fluctuations in Vertical NAND flash memories," 2012 Symposium on VLSI Technology, Digest of Technical Papers, pp. 21-22, Jun. 12-14, 2012.
Paul et al., "Impact of a Process Variation on Nanowire and Nanotube Device Performance," IEEE Trans. on Electron Devices, vol. 54, No. 9, Sep. 2007, pp. 2369-2376.
Tanaka et al., "Bit Cost Scalable Technology with Punch and Plug Process for Ultra High Density Flash Memory," VLSI Technology, 2007 IEEE Symposium on Jun. 12-14, 2007, pp. 14-15.
U.S. Appl. No. 14/038,526, "Contact Structure and Forming Method", filed Sep. 26, 2013.
U.S. Appl. No. 13/936,729, "Array Arrangement Including Carrier Source", filed on Jul. 8, 2013.
Wang H-H et al., "A New Read-Disturb Failure Mechanism Caused by Boosting Hot-Carrier Injection Effect in MLC NAND Flash Memory," IEEE International Memory Workshop, 2009, May 10-14, 2009, pp. 1-2.
Wang, Michael, "Technology Trends on 3D-NAND Flash Storage", Impact 2011, Taipei, dated Oct. 20, 2011, found at www.impact.org.tw/2011/Files/NewsFile/201111110190.pdf.

\* cited by examiner

SUBSTRATE CONNECTION OF THREE DIMENSIONAL NAND FOR IMPROVING ERASE PERFORMANCE

RELATED APPLICATIONS

This application is a continuation-in-part of U.S. patent application Ser. No. 13/936,729, filed 8 Jul. 2013 (U.S. Pat. No. 9,076,535) and is incorporated herein by reference.

BACKGROUND

1. Field of the Invention

The present invention relates to high density memory devices, and particularly to memory devices which can include thin film memory cells arranged to provide a three-dimensional 3D array.

2. Description of Related Art

High density memory devices are being designed that comprise arrays of flash memory cells, or other types of memory cells. In some examples, the memory cells comprise thin film transistors which can be arranged in 3D architectures.

3D memory devices have been developed in a variety of configurations that include a plurality of thin film, active strips separated by insulating material. One type of 3D memory device that uses thin film transistors as the memory cells is known as a 3D vertical gate structure such as is described in our co-pending U.S. patent application Ser. No. 13/078,311; filed 1 Apr. 2011, entitled MEMORY ARCHITECTURE OF 3D ARRAY WITH ALTERNATING MEMORY STRING ORIENTATION AND STRING SELECT STRUCTURES (US 2012/0182806 A1, published 19 Jul. 2012) which is incorporated by reference as if fully set forth herein. The 3D vertical gate structure includes a plurality of stacks of thin film strips with word line structures that overlie the stacks, such that the portions of the word line structures that extend vertically between the stacks act as the word lines for the memory cells at the cross-points with the strips. The thin film active strips in this structure, and in other memory structures, may be lightly doped and have no body contact, which can isolate them from sources of charge carriers needed during operation of the device. Conditions in which sources of charge carriers are insufficient can harm operating efficiencies.

It is desirable to provide a structure for three-dimensional integrated circuit memory with higher array efficiency.

SUMMARY

Technology is described which can address the need for a source of charge carriers in thin film transistor-based memory devices.

For example, a memory can include a doped substrate well, a substrate connector coupled to the doped substrate well, and a set of interlayer connectors insulated from the doped substrate well. A series arrangement that includes a plurality of memory cells, such as in a NAND string, is coupled on a first end by a first switch to a bit line and coupled on a second end by a second switch to a source line contact pad, where the source line contact pad is connected to the substrate connector and to at least one of the interlayer connectors in the set of interlayer connectors. A supply line is connected to the set of interlayer connectors. A plurality of word lines are coupled to corresponding memory cells in the plurality of memory cells. Circuitry is included that is coupled to the supply line and to the doped substrate well and that is configured to bias the supply line and the doped substrate well with different bias conditions depending on the mode of operation. The memory can include a pickup contact to the doped substrate well, to which the circuitry is connected for biasing the doped substrate well.

In one example, the circuitry can be configured to apply an erase bias arrangement that induces hole tunneling in selected memory cells or in a block of memory cells. The erase bias arrangement for an n-channel memory cell can include a source side bias voltage on the doped substrate well, providing a source of holes to the active strip or strips being erased. Also, the erase bias arrangement can include leaving the supply line floating, and applying erase voltages to the plurality of word lines to induce hole tunneling, where the erase voltages to the plurality of word lines can be non-negative. The circuitry can also be configured to apply a program bias arrangement that induces electron tunneling. A program bias arrangement can include applying a source side bias on the supply line which provides a current path for the program operation, while the doped substrate well is applied the same source side bias.

In general, a technology is provided which provides a source of charge carriers for active strips of semiconductor material from a semiconductor substrate.

Other aspects and advantages of the present invention can be seen on review of the drawings, the detailed description and the claims, which follow.

DETAILED DESCRIPTION

Figure 1:
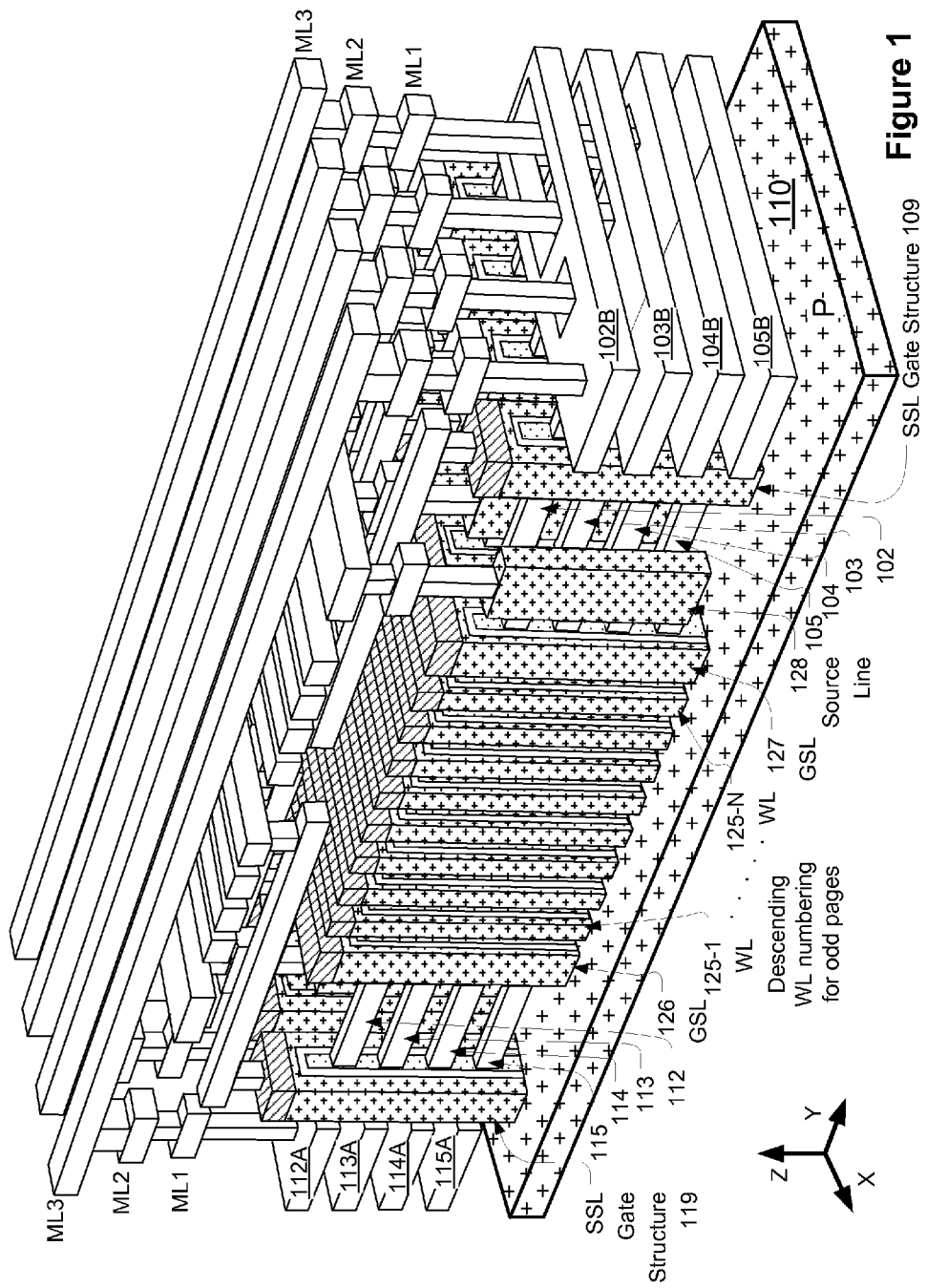
FIG. 1 is a perspective illustration of a 3D vertical gate NAND memory array structure including thin film active strips with no body contact.

A detailed description of embodiments is provided with reference to the Figures. The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 is a perspective illustration of a 3D NAND memory array structure as described in co-pending U.S. patent application Ser. No. 13/078,311, referred to above. Insulating material is removed from the drawing to expose additional structure for illustrative purposes. For example, insulating layers are removed between the active strips (e.g. 112-115) in stacks, and are removed between the stacks of active strips.

The multilayer array is formed on an insulating layer, and includes a plurality of word lines 125-1 WL, . . . , 125-N WL conformal with the plurality of stacks. The insulating layer can be formed on a doped substrate well (e.g. 110), such as a P type substrate well, surrounded by a deep N substrate well (not shown). The plurality of stacks includes active strips 112, 113, 114, 115, that comprise thin film strips of semiconductor material having a relatively low concentration of impurities, or alternatively of intrinsic semiconductor material configured to act as channels for the NAND strings. The memory devices can be configured for n-channel or p-channel operation. The active strips do not include source/drain contacts between the word lines in some example structures, and are therefore termed "contact-free" strips. Also, the active strips are not connected to a semiconductor substrate, or other semiconductor body, and therefore can be considered to be "floating" when no voltage is applied to them via the string select or ground select switches.

Active strips in the same level are electrically coupled together by a pad arranged to have a landing area for contact to an interlayer conductor. The pads for a plurality of layers can be arranged in stairstep structures as shown in FIG. 1, with the landing area on each successive pad disposed on a step of the structure. Landing areas for connection of the pads and the interlayer conductors to the landing areas on the pads can be arranged in patterns other than a simple stairstep, if desired or needed for a particular manufacturing setting.

The shown word line numbering, ascending from 1 to N going from the back to the front of the overall structure, applies to even memory pages. For odd memory pages, the word line numbering descends from N to 1 going from the back to the front of the overall structure.

Pads 112A, 113A, 114A, 115A terminate alternate active strips, such as active strips 112, 113, 114, 115 in each layer in this example. As illustrated, these pads 112A, 113A, 114A, 115A are electrically connected to different bit lines for connection to decoding circuitry to select planes within the array. These pads 112A, 113A, 114A, 115A can be patterned at the same time that the plurality of stacks are defined.

Pads 102B, 103B, 104B, 105B terminate the other alternate active strips, such as active strips 102, 103, 104, 105 in each layer. As illustrated, these pads 102B, 103B, 104B, 105B are electrically connected to different bit lines for connection to decoding circuitry to select planes within the array. These pads 102B, 103B, 104B, 105B can be patterned, with possibly the exception of vias to the landing areas, at the same time that the plurality of stacks are defined.

In other examples, all the active strips in a block can terminate at a bit line pad on the same end.

Any given stack of active strips is coupled to either the pads 112A, 113A, 114A, 115A, or the pads 102B, 103B, 104B, 105B, but not both, in the illustrated example. A stack of active strips has one of the two opposite orientations of bit line end-to-source line end orientation, or source line end-to-bit line end orientation. For example, the stack of active strips 112, 113, 114, 115 has bit line end-to-source line end orientation; and the stack of active strips 102, 103, 104, 105 has source line end-to-bit line end orientation.

The stack of active strips 112, 113, 114, 115 is terminated at one end by the pads 112A, 113A, 114A, 115A, passes through SSL gate structure 119, ground select line GSL 126, word lines 125-1 WL through 125-N WL, ground select line GSL 127, and is terminated at the other end by source line 128. The stack of active strips 112, 113, 114, 115 does not reach the pads 102B, 103B, 104B, 105B.

The stack of active strips 102, 103, 104, 105 is terminated at one end by the pads 102B, 103B, 104B, 105B, passes through string select SSL gate structure 109, ground select line GSL 127, word lines 125-N WL through 125-1 WL, ground select line GSL 126, and is terminated at the other end by a source line (obscured by other parts of figure). The stack of active strips 102, 103, 104, 105 does not reach the pads 112A, 113A, 114A, 115A.

A layer of memory material separates the word lines 125-1 WL through 125-N WL, from the active strips 112-115 and 102-105. Ground select lines GSL 126 and GSL 127 are conformal with the plurality of active strips, similar to the SSL gate structures.

Every stack of active strips is terminated at one end by pads, and at the other end by a source line. For example, the stack of active strips 112, 113, 114, 115 is terminated at one end by pads 112A, 113A, 114A, 115A, and terminated on the other end by source line 128. At the near end of the figure, every other stack of active strips is terminated by the pads 102B, 103B, 104B, 105B; and every other stack of active strips is terminated by a separate source line. At the far end of the figure, every other stack of active strips is terminated by the pads 112A, 113A, 114A, 115A, and every other stack of active strips is terminated by a separate source line.

Bit lines and string select lines are formed at patterned conductor layers, such as metals layers ML1, ML2, and ML3. Transistors are formed at cross-points between the active strips (e.g. 112-115) and the word line 125-1 WL through 125-N WL. In the transistors, the active strip (e.g. 113) acts as the channel region of the device.

String select structures (e.g. 119, 109) can be patterned during the same step that the word lines 125-0 through 125-15 are defined. Transistors are formed at cross-points between the active strips (e.g. 112-115) and the string select structures (e.g. 119, 109). These transistors act as string select switches coupled to decoding circuitry for selecting particular stacks in the array.

A charge storage structure layer is disposed at least in the cross-points in which memory cells are formed. The charge storage layer structure can comprise a multilayer dielectric charge storage structure such as SONOS-like structures. One dielectric charge storage structure is known as bandgap engineered SONOS, or "BE-SONOS." A BE-SONOS charge storage structure can include a multilayer tunneling layer, such as a layer of silicon oxide about 2 nm thick, a layer of silicon nitride about 2 to 3 nm thick and a layer of silicon oxide about 2 to 3 nm thick. A BE-SONOS structure includes a dielectric layer for storing charge on the multilayer tunneling layer, such as a layer of silicon nitride about 5 to 7 nm thick. Also, a BE-SONOS structure includes a dielectric layer for blocking charge leakage on the charge storage layer, such as a layer of silicon oxide about 5 to 8 nm thick. Other materials may be utilized as well in the BE-SONOS stack.

In a device including a BE-SONOS charge storage layer, an erasing operation can include FN tunneling holes from the channel to the charge storage layer to compensate the trapped electrons in the charge storage layer.

However, for a structure like that shown in FIG. 1, there is no P+ region within the whole string. As described herein, a carrier source structure connected to a doped substrate well can generate holes source to solve this issue.

Figure 2:
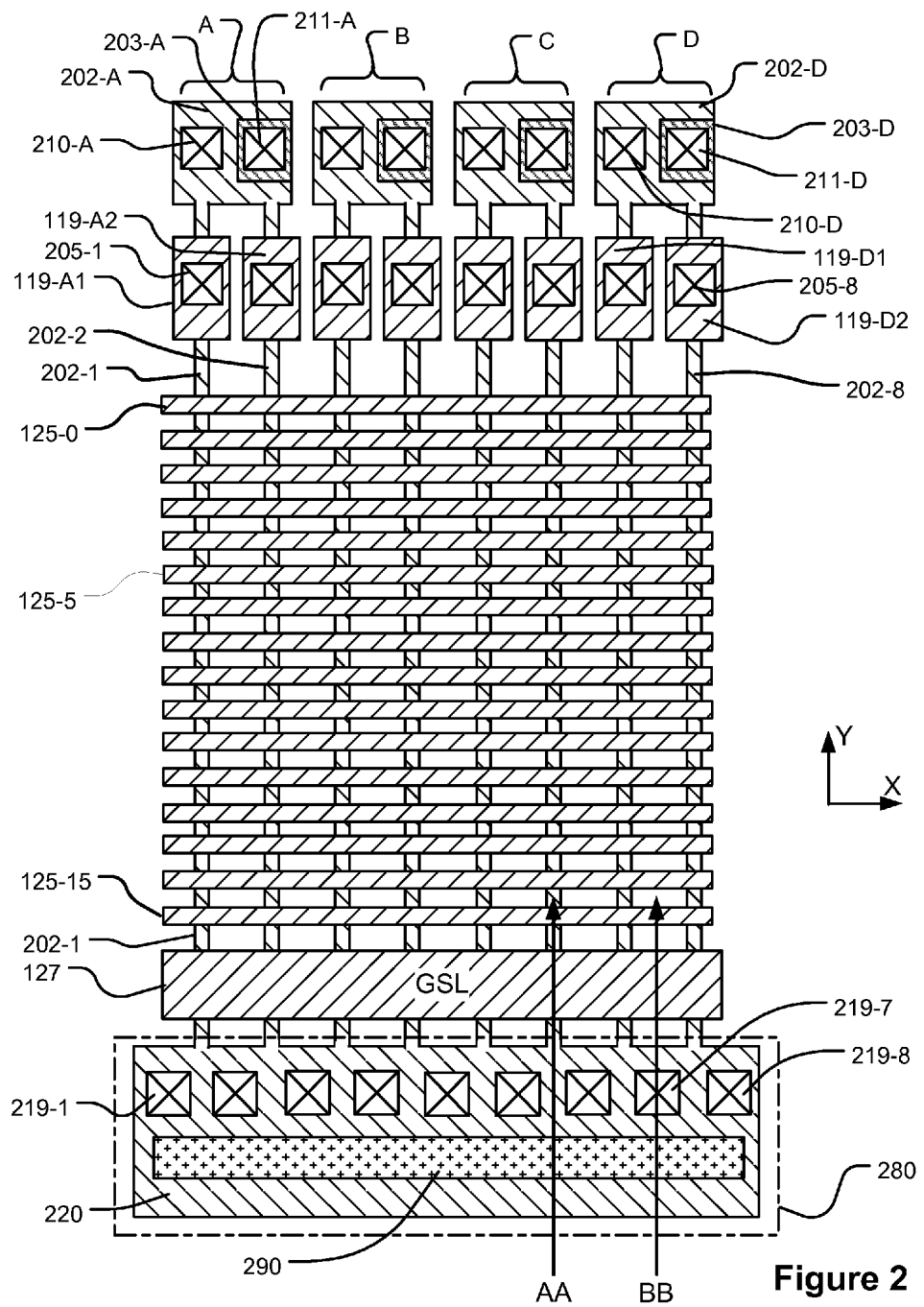
FIG. 2 is a layout view of one embodiment of a 3D vertical gate memory as described herein.

FIG. 2 is a layout view of one embodiment of a 3D vertical gate memory as described herein. For reference, the "X" axis lies in the horizontal direction parallel to the word lines (e.g. 125-0, 125-5, 125-14, 125-15) in the structure, the "Y" axis lies in the horizontal direction parallel to the active strips (e.g. 202-1, 202-2, 202-8) in the structure, and the "Z" axis lies in the vertical direction orthogonal to the word lines and to the active strips in the structure.

In the layout view of FIG. 2, the array arrangement includes a plurality of active strips. The memory cells are disposed at cross-points of active strips (e.g. 202-1, 202-2, 202-8) and word lines (e.g. 125-0, 125-5, 125-14, 125-15). In the illustrated example, there are four blocks of cells, labeled generally A, B, C, D, each having for the purposes of a simplified example, two stacks of active strips two layers deep. In other embodiments, there may be more layers such as 4, 8, 16 or more, and there may be stacks of strips per block, such as 4, 8, 16 or more. In this example, the four illustrated blocks A, B, C, D share a carrier source structure (e.g. 280) as described in more detail below.

Figure 3A:
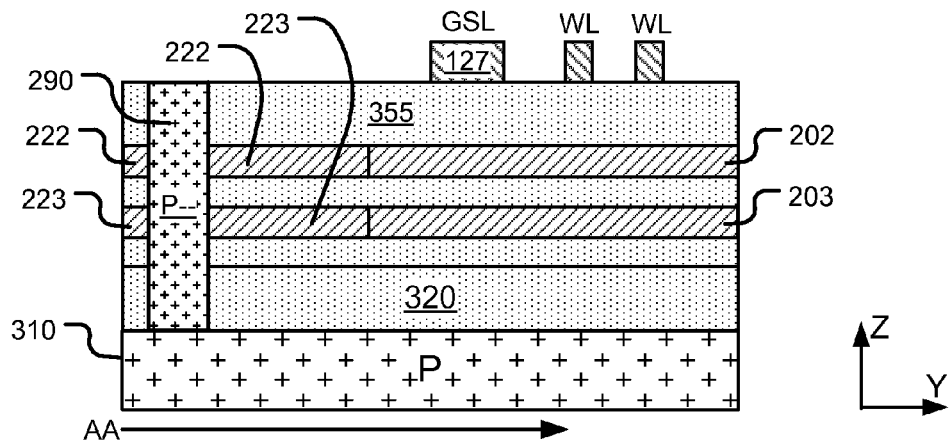
FIGS. 3A and 3B illustrate a carrier source structure suitable for use in a 3D memory such as that described with reference to FIG. 2.
Figure 3B:
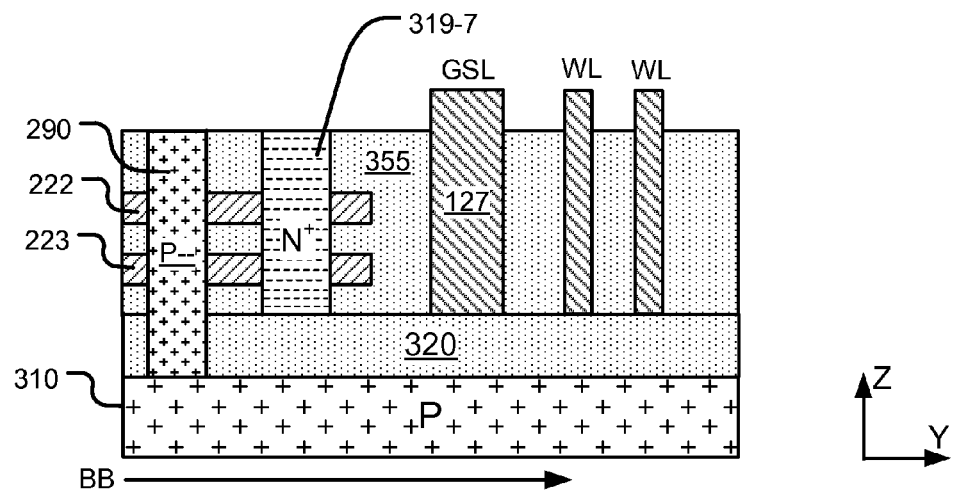

The active strips in the top level run from a corresponding pad (top level pads 202-A, 202-D) at the top to the carrier source structure with a set of supply line contacts (e.g. 219-1 to 219-8) and a substrate connector (e.g. 290) coupled to a doped substrate well (e.g. 310, FIGS. 3A and 3B). The substrate connector 290 can provide a hole current path from the doped substrate well 310 to the active strips (e.g. 202-1, 202-2, 202-8) in erase operations. Erase operations using the substrate connector are described in connection with FIG. 11. A supply line can be connected to the supply line contacts 219-1 to 219-8. The carrier source structure can replace the common source lines 128 of the structure in FIG. 1.

The active strips in the lower level run from a corresponding pad (lower level pads 203-A, 203D) which are accessible through stairstep openings in the upper level pads as shown. Interlayer connectors 210-A to 210-D and 211-A to 211-D couple the pads to overlying bit lines in a patterned conductor layer for example, like those in ML3 shown in FIG. 1. In one embodiment, interlayer connectors 210-A to 210-D and 211-A to 211-D can be made with a minimal incremental layer cost process (MiLC).

Overlying the active strips (e.g. 202-1, 202-2, 202-8), are the horizontal word lines (e.g. 125-0, 125-5, 125-14, 125-15) and the horizontal ground select line GSL 127. Also overlying the active strips, are the string select line SSL gate structures, including SSL gate structures 119-A1 and 119-A2 for the strips coupled to pads 202-A and 203-A, SSL gate structures 119-D1 and 119-D2 for the strips coupled to pads 202-D and 203D, and similar SSL gate structure for blocks B and C not given reference numerals. The string select structures control electrical connection between any active strip and the active strip's corresponding pad (e.g. 202-A, 203-A). Interlayer connectors 205-1 to 205-8 couple the SSL gate structures to overlying SSL lines in a patterned conductor layer for example, like those in ML2 shown in FIG. 1.

The 3D NAND memory device includes a plurality of planes of memory cells. A plurality of bit lines selects a particular plane in the plurality of planes of memory cells via pads (e.g. 202-A and 203-A). The particular plane is decoded by a plurality of string select structures, horizontal ground select lines GSL, and word lines. To select a particular stack (e.g. including top level strip 202-1) in an n-channel embodiment, a positive SSL voltage ($V_{SSL}$) is applied to the string select structure (119-A1). To unselect other stacks, a voltage of 0V, for example, can be applied to the string select structures.

FIGS. 3A and 3B illustrate side views of a carrier source structure suitable for use in a 3D memory such as that described with reference to FIG. 2, taken along AA and BB in FIG. 2, respectively.

As shown in the example of FIGS. 3A and 3B, the carrier source structure includes a stack of source line contact pads (e.g. 222, 223) separated by insulating material (e.g. 355) overlying a doped substrate well (e.g. 310), such as a P type substrate well surrounded by a deep N substrate well (not shown). The carrier source structure includes a column of lightly doped P-type semiconductor material (e.g. 290) which is connected to the source line contact pads in the stack and to the doped substrate well 310. The carrier source structure includes a pillar of N+ semiconductor material (e.g. 319-7) which is connected to the source line contact pads in the stack and insulated from the doped substrate well 310 by a bottom insulating layer (e.g. 320). The pillar 319-7 is connected by the supply line contact 219-7 to a supply line (not shown).

In this example, source line contact pads (e.g. 222, 223) contact the strips of semiconductor material in respective levels in the 3D array (e.g. 202, 203). Source line contact pads 222 and 223 are shown on both sides of the pillar 319-7 and on both sides of the column 321 because the source line contact pads (e.g. 220) are formed around the pillar and the column.

Figure 4:
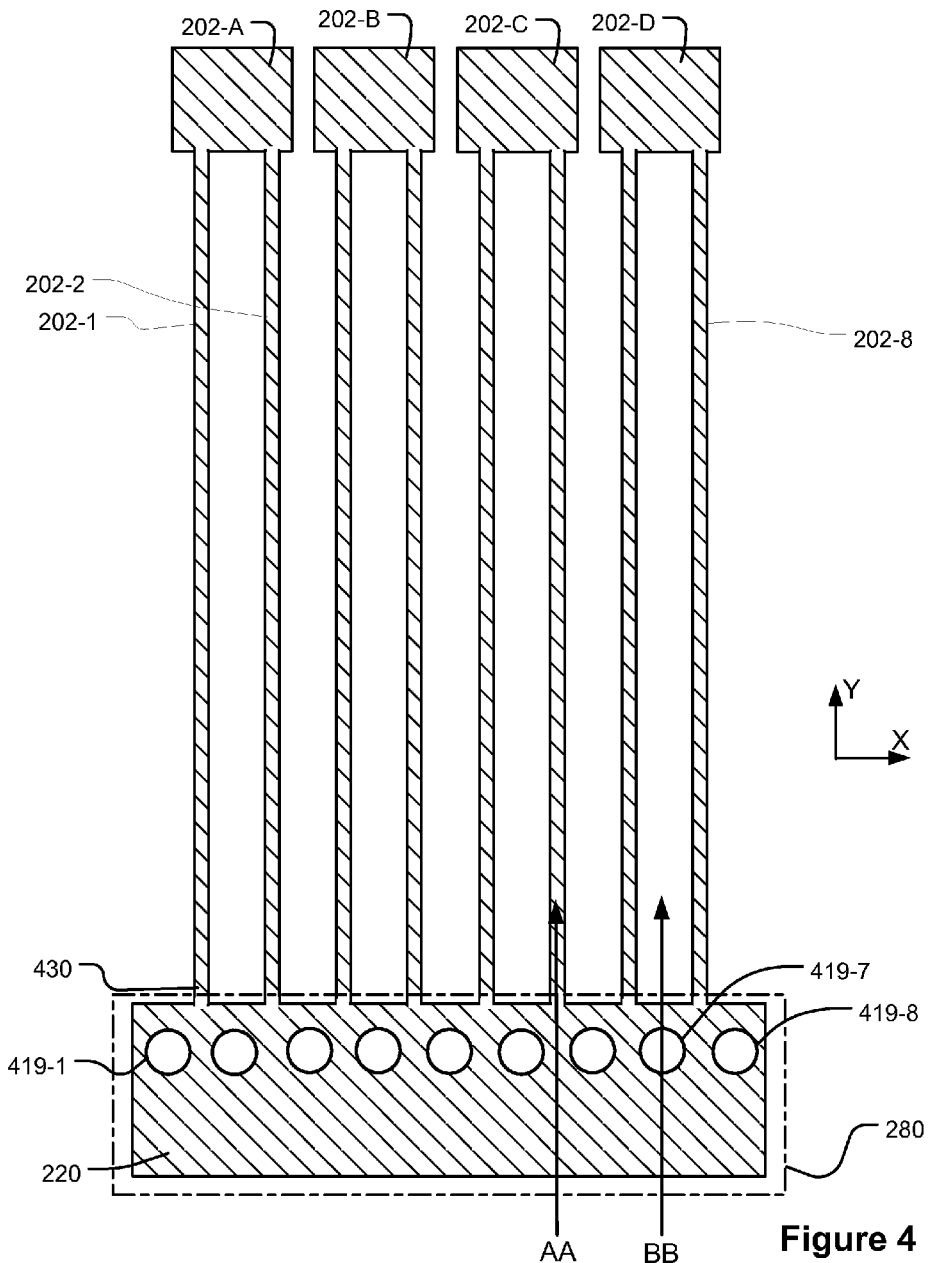
FIG. 4 is a layout view of an intermediate structure in the manufacturing process for a structure like that of FIG. 2 with a carrier source structure like that FIGS. 3A and 3B.

FIG. 4 is a layout view of an intermediate structure in the manufacturing process for a structure like that of FIG. 2 with a carrier source structure like that of FIGS. 3A and 3B. In the example of FIG. 4, the pattern of an etch after formation of alternating stacks of active material and insulating material is shown. In this etch, active strips 202-1, 202-2, and 202-8 are formed that are connected on a first end to the bit line contact pads 202-A, 202-B, 202-C, and 202-D. The active strips are connected on the second end (e.g. 430) to the supply line contact pad 220, which can be patterned at the same time that the stacks of active material are defined. In this example, openings 419-1 through 419-8 are formed through the upper supply line contact pad down to the level of the lower supply line contact pad.

Figure 5A:
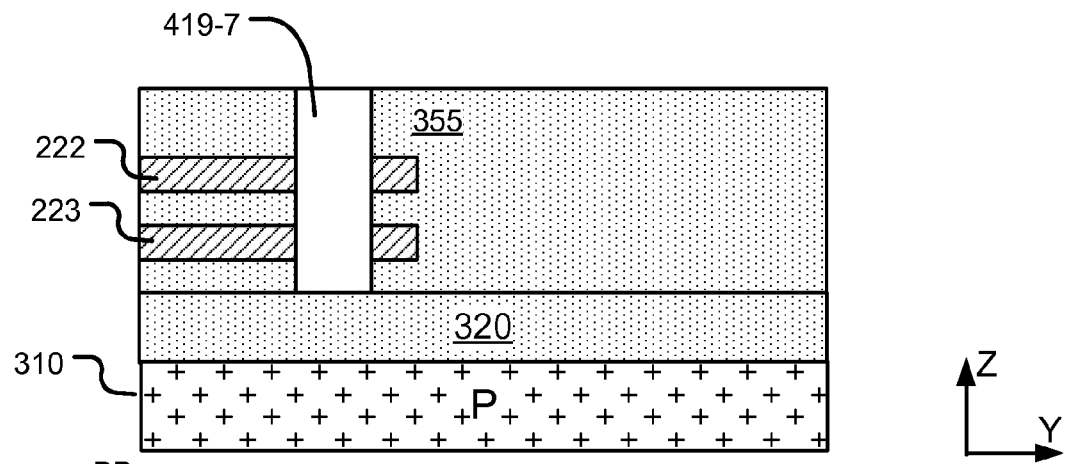
FIGS. 5A, 5B, 6A, 6B, 7, 8A, 8B, 9A and 9B illustrate stages in the manufacturing process which results in a carrier source structure like that shown in FIGS. 3A and 3B.

FIGS. 5A, 5B, 6A, 6B, 7, 8A, 8B, 9A and 9B illustrate stages in the manufacturing process which results in a carrier source structure like that shown in FIGS. 3A and 3B. FIG. 5A is a side view of the carrier source structure, along BB in FIG. 4, showing opening 419-7 which extends through the stack of source line contact pads (e.g. 222, 223) to the bottom insulating layer 320 on the doped substrate well 310.

Figure 5B:
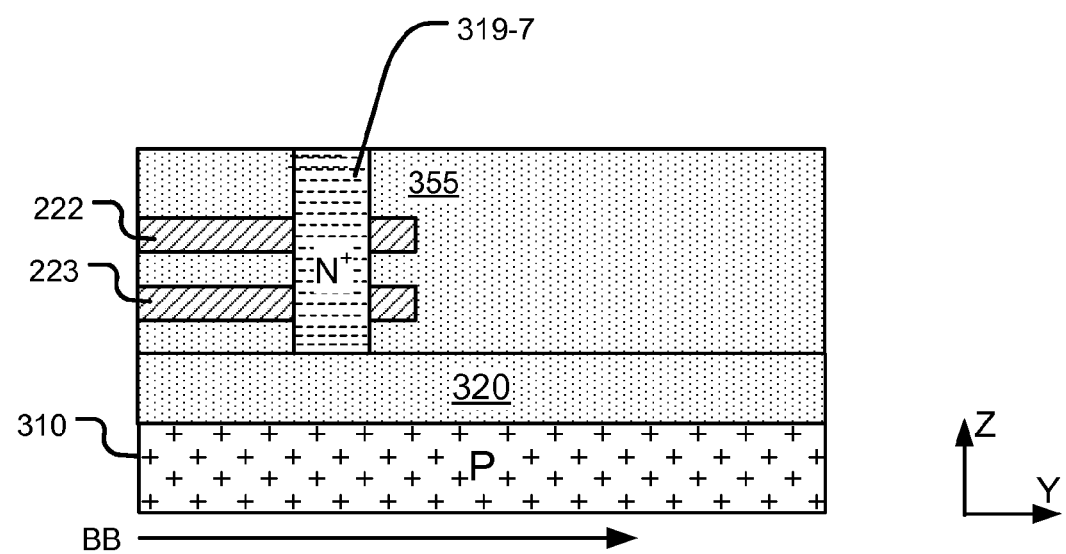

FIG. 5B is a side view of the carrier source structure, along BB in FIG. 4, after formation of a pillar of N+ semiconductor material (e.g. 319-7) in the opening 419-7. The pillar extends through the supply line contact pads (e.g. 222, 223) which are connected to respective active strips (e.g. 202, 203, FIG. 3A).

Figure 6A:
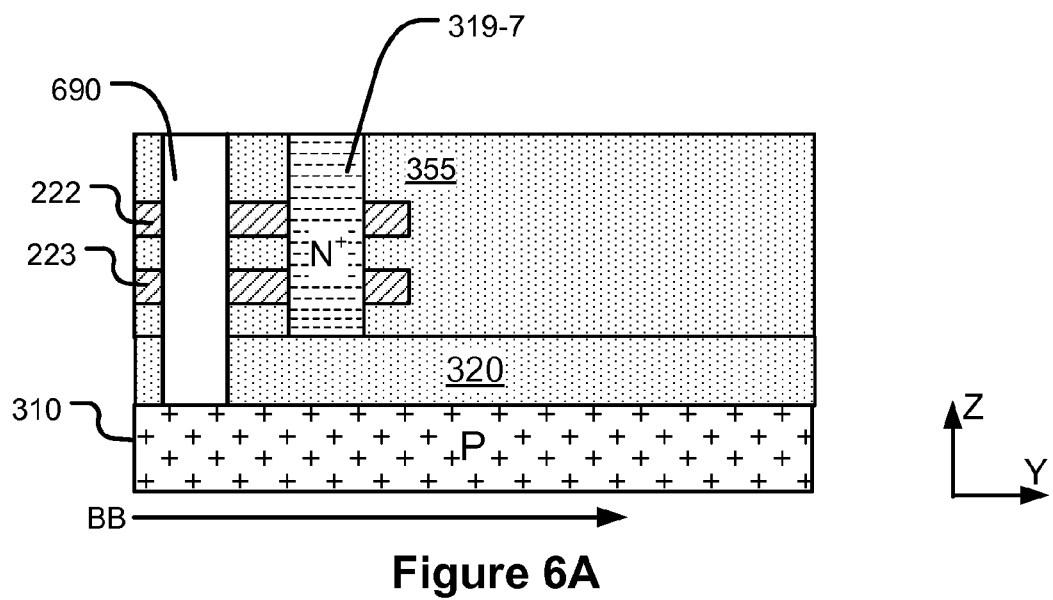

FIG. 6A is a side view of the carrier source structure, along BB in FIG. 4, showing opening 690 which extends through the stack of source line contact pads (e.g. 222, 223) and through the bottom insulating layer 320 to the doped substrate well 310.

Figure 6B:
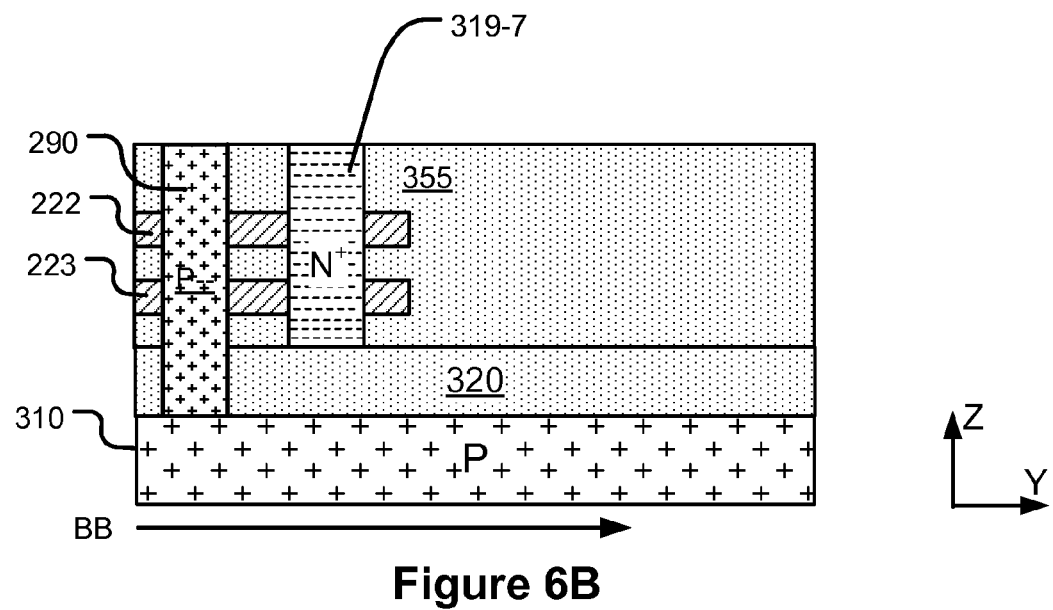

FIG. 6B is a side view of the carrier source structure, along BB in FIG. 4, after formation of the column of lightly doped p-type semiconductor material (e.g. 290) in the opening 690. The column extends through the supply line contact pads (e.g. 222, 223) coupled to the active strips (e.g. 202, 203, FIG. 3A), and through the bottom insulating layer 320, to the doped substrate well 310.

Figure 7:
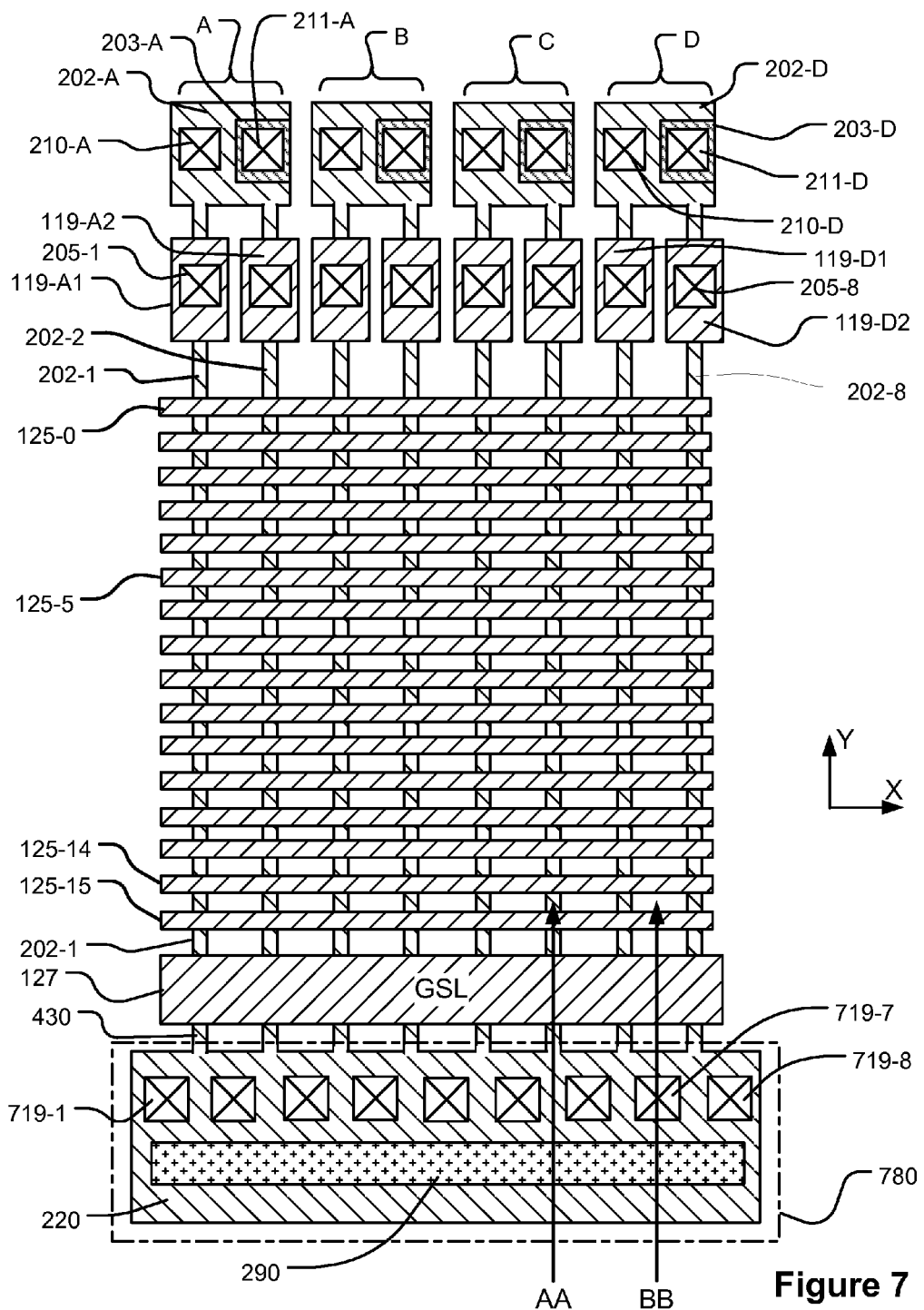

FIG. 7 is a plan view showing results of many of the steps described above in connection with the manufacturing process. Thus, this plan view shows the stairstep contacts in the region of the bit line contact pads, contacts over the string select structures, a set of interlayer connectors (e.g. 719-1, 719-7, 719-8), and the substrate connector (e.g. 290) for connection to the doped substrate well (e.g. 310, FIGS. 6A and 6B).

Figure 8A:
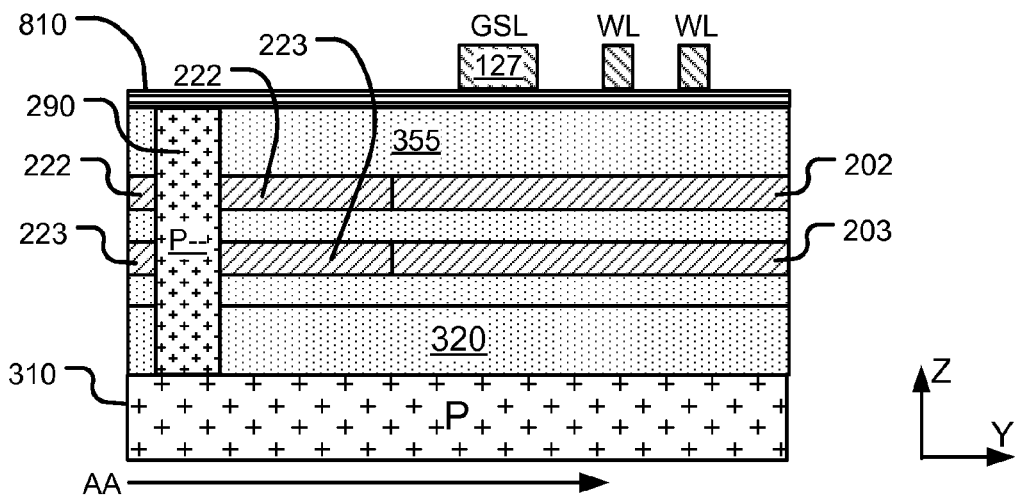
Figure 8B:
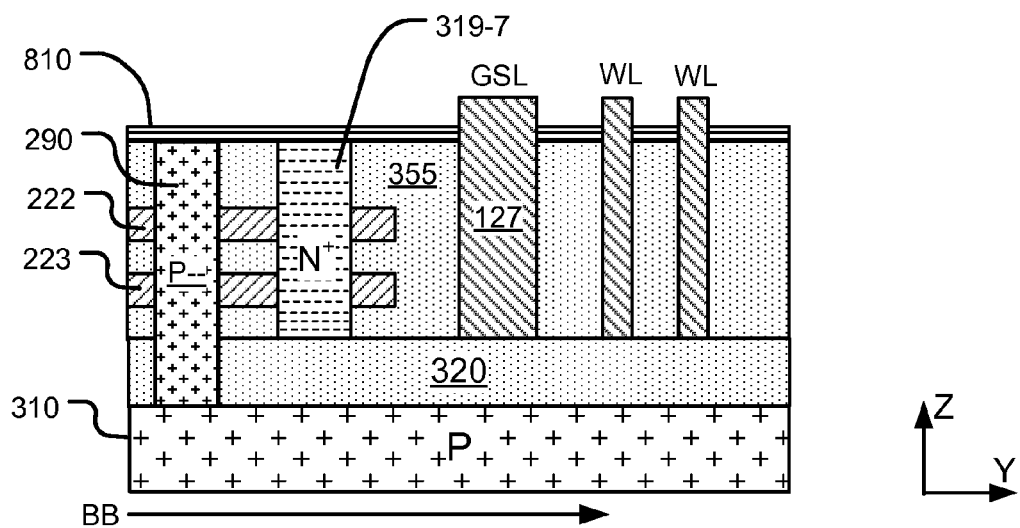

FIGS. 8A and 8B are side views of the carrier source structure, showing the results of forming a charge storage layer 810 over patterned active strips, the horizontal word lines WL (e.g. 125-0, 125-5, 125-14, 125-15, FIG. 7), and the horizontal ground select line GSL 127 overlying the active strips. FIG. 8A is taken along AA in FIG. 7, while FIG. 8B is taken along BB in FIG. 7.

Figure 9A:
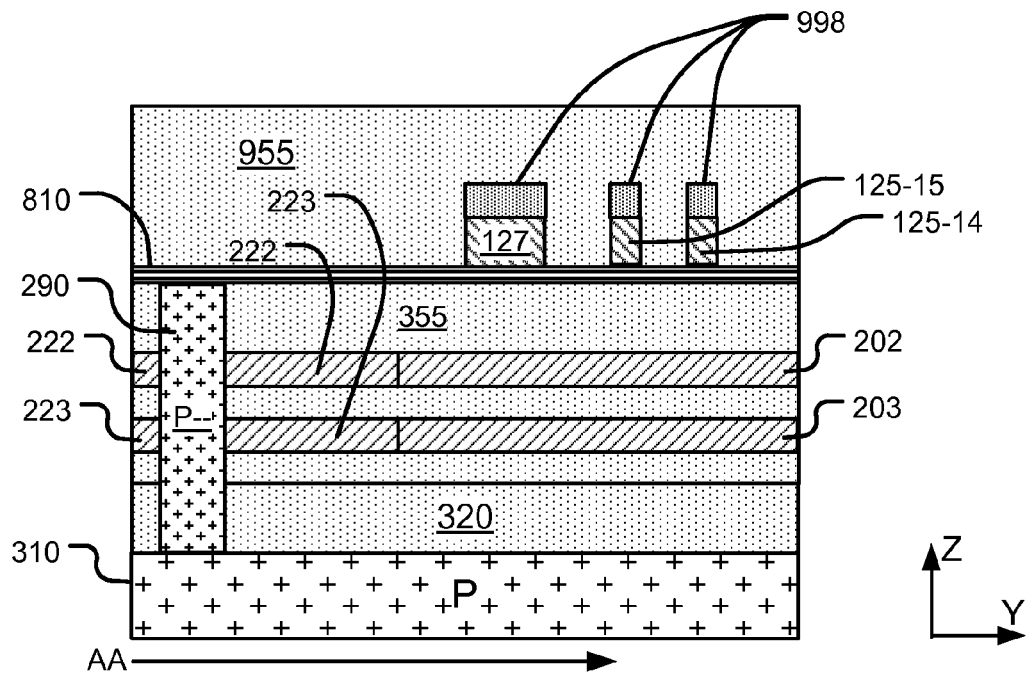
Figure 9B:
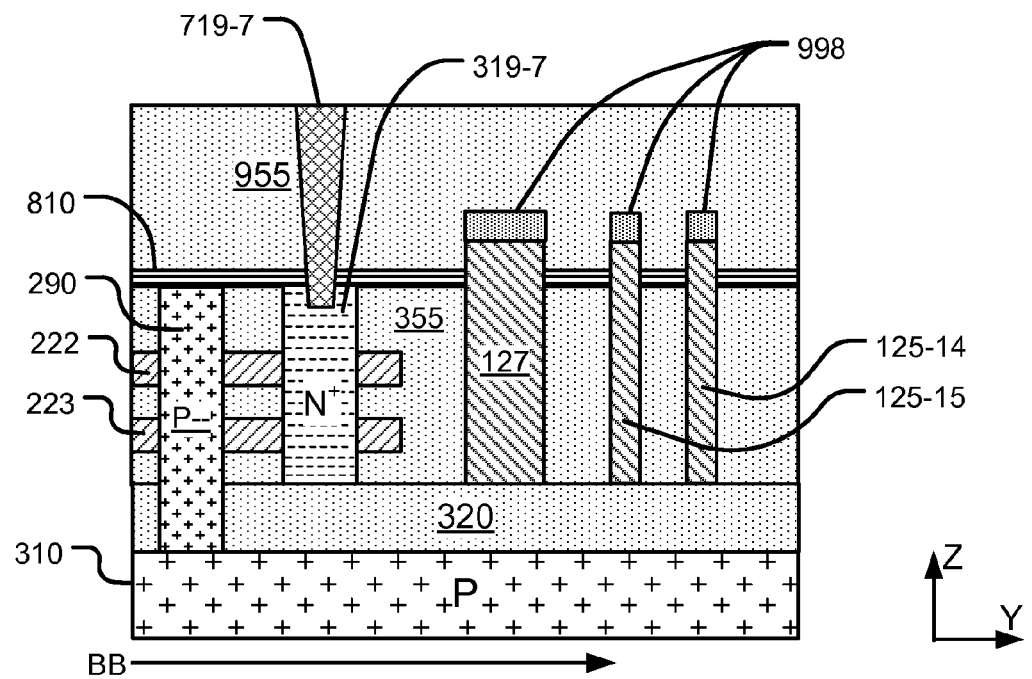

FIGS. 9A and 9B illustrate a result of formation of the substrate connector 290 which connects to the doped substrate well 310, formation of a silicide layer 998, such as a cobalt silicide, on ground select line GSL (e.g. 127) and word lines (e.g. 125-15, 125-14), formation of insulating fill 955, and formation of the set of interlayer connectors (e.g. 719-7) which connects the pillar of N+ semiconductor material (e.g. 319-7). FIG. 9A is taken along AA in FIG. 7, while FIG. 9B is taken along BB in FIG. 7.

Figure 10:
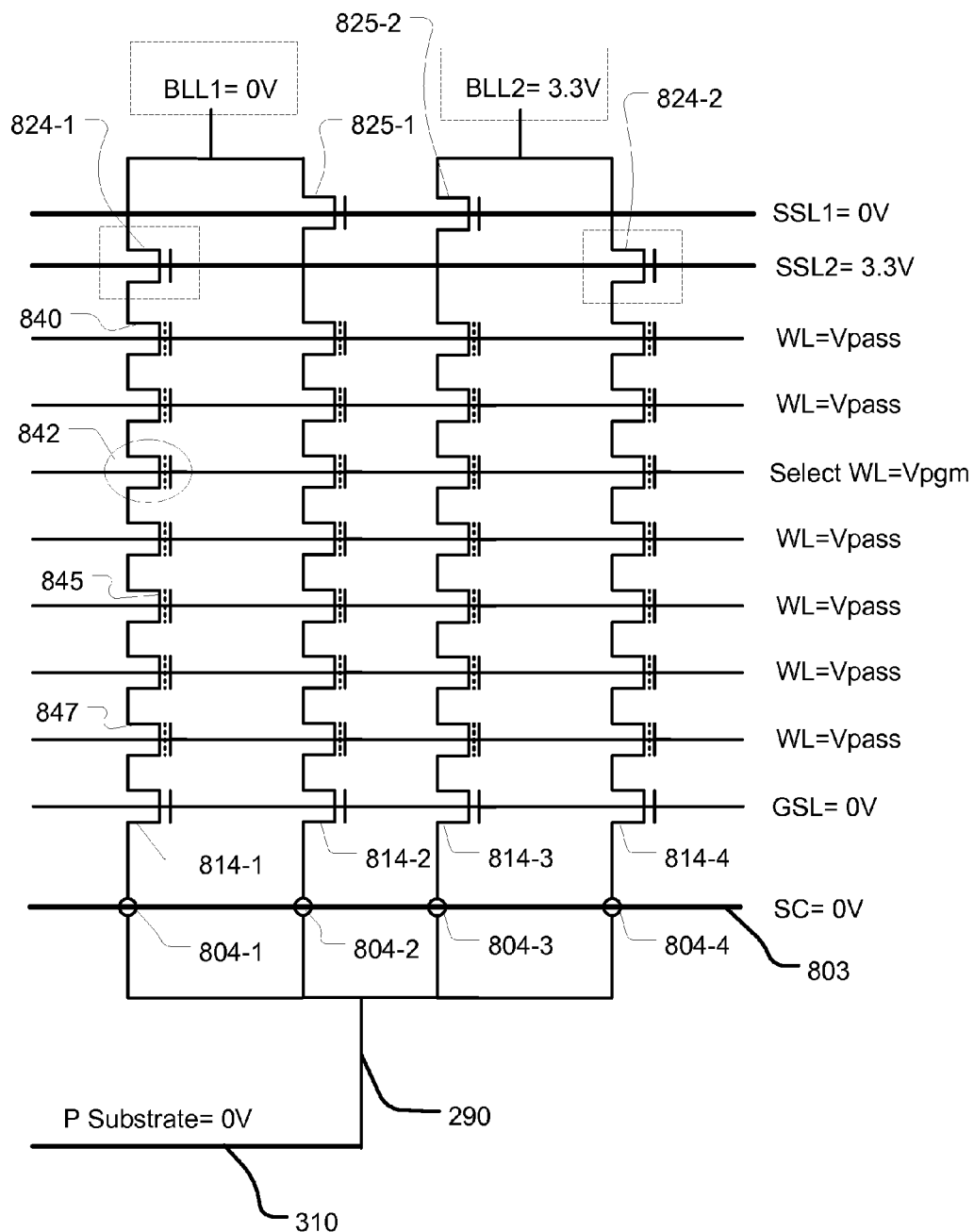
FIG. 10 is a schematic diagram of a 3D NAND like that of FIG. 2, showing a bias arrangement for a programming operation.
Figure 11:
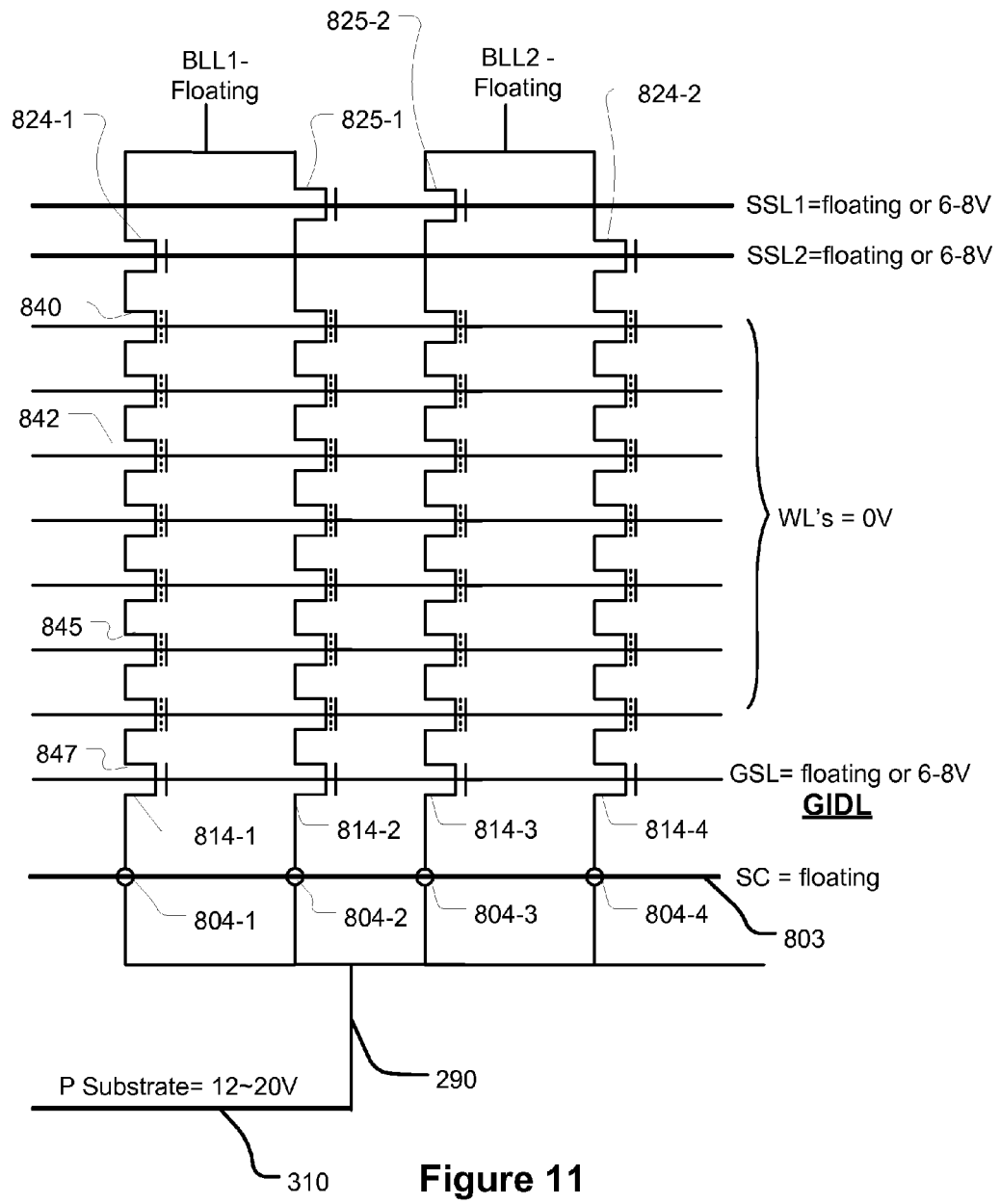
FIG. 11 is a schematic diagram of a 3D NAND like that of FIG. 2, showing a bias arrangement for an erase operation.
Figure 12:
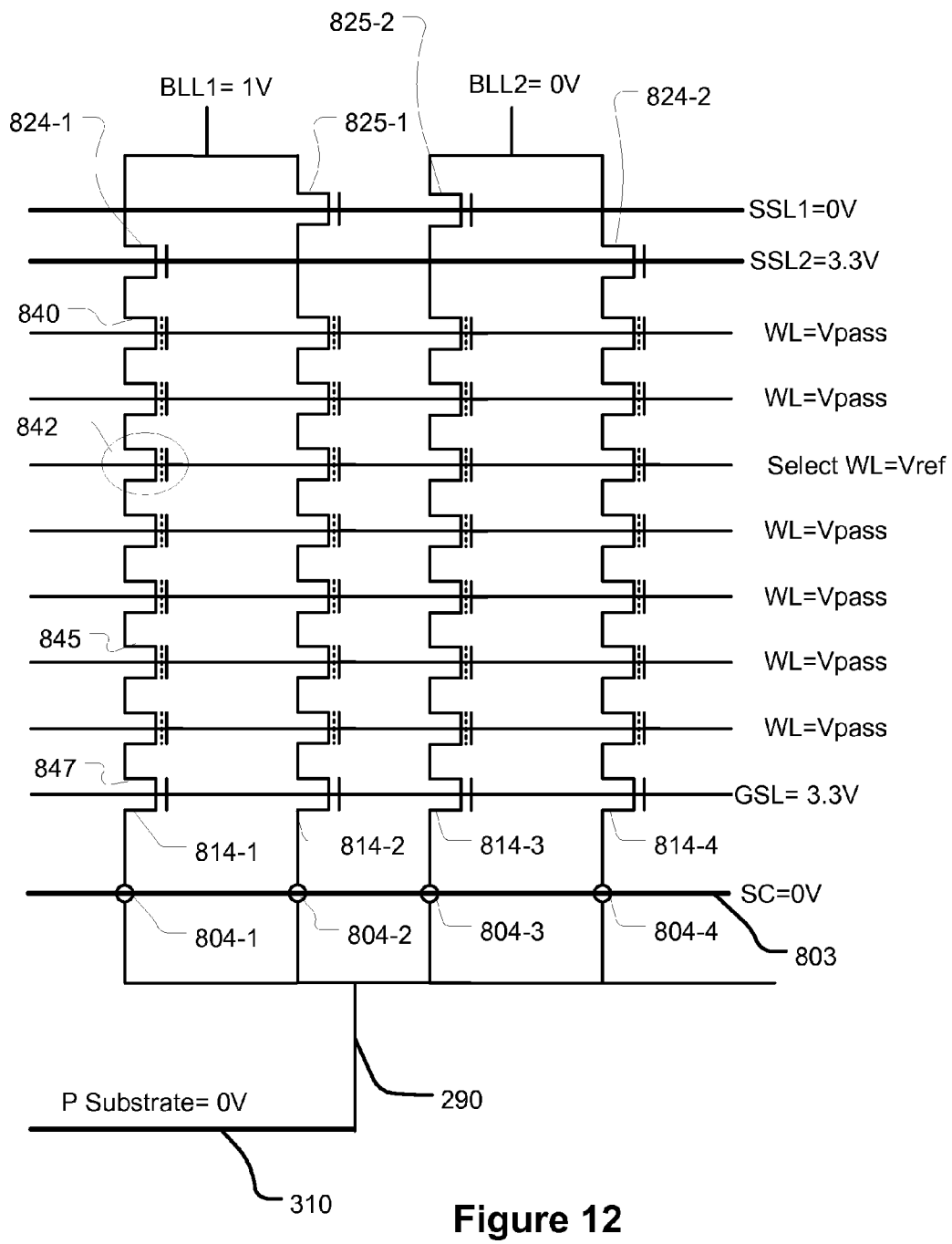
FIG. 12 is a schematic diagram of a 3D NAND like that of FIG. 2, showing a read bias arrangement.

FIGS. 10-12 are schematic diagrams for a two-layer 3D array of one of the blocks, e.g. block A, in the structure shown in FIG. 2, which can have the carrier source structure of FIGS. 3A and 3B. Although standard transistor symbols are used, embodiments described herein comprise junction-free NAND strings.

For clarity purposes, the term "program" as used herein refers to an operation which increases the threshold voltage of a memory cell. The data stored in a programmed memory cell can be represented as a logical "0" or logical "1." The term "erase" as used herein refers to an operation which decreases the threshold voltage of a memory cell. The data stored in an erased memory cell can be represented as the inverse of the programmed state, as a logical "1" or a logical "0." Also, multibit cells can be programmed to a variety of threshold levels, and erased to a single lowest threshold level or highest threshold level, as suits a designer. Further, the term "write" as used herein describes an operation which changes the threshold voltage of a memory cell, and is intended to encompass both program and erase, or a combination of program and erase operations.

A program operation described herein includes biasing selected memory cells to inject electrons into the charge storage structure of a selected memory cell, thereby increasing the threshold voltage. A program operation can be applied to program one or more selected memory cells in a page, in a word or in a byte for example. During the program operation, unselected memory cells are biased to prevent or reduce disturbance of stored charge.

A block erase operation described herein for an n-channel memory, includes biasing a block of cells to inject holes into the charge storage structures of cells in the selected block, thereby reducing the threshold voltages, at least in cells of the block that do not already have a low threshold voltage. Other program and erase biasing operations may be utilized.

As shown in FIG. 10, the block includes four NAND strings, including two strings connected to the level one bit line BLL1 and two strings coupled to the level two bit line BLL2. The string select structure for a first one of the stacks of active strips includes string select switches 824-1 and 824-2 which are connected to a string select line SSL1. Likewise, the string select structures for a second one of the stacks of active strips includes string select switches 825-1 and 825-2 which are connected to a string select line SSL2. The ground select line GSL overlies the active strips, forming four ground select switches 814-1, 814-2, 814-3, and 814-4. Also, the active strips are coupled to a supply line 803 by a set of interlayer connectors 804-1, 804-2, 804-3, 804-4, and are coupled to a doped substrate well 310 by a substrate connector 290. The same circuit configuration is illustrated in each of FIGS. 10-12.

In FIG. 10, a biasing arrangement for programming a selected cell is illustrated. In FIG. 11, a biasing arrangement for erasing the block of memory cells is illustrated. In FIG. 12, a biasing arrangement for reading a selected cell in the block is illustrated.

Thus, the memory circuit includes a series arrangement of a plurality of memory cells, such as the string including memory cells 840, 842, 845, 847. The series arrangement is coupled on a first end by a first switch (e.g. 824-1) to a bit line BLL1. Series arrangement is coupled on a second end by a second switch (e.g. 814-1) to the carrier source structure. The memory circuit also includes a plurality of word lines WL. Circuitry is coupled to the supply line, to the doped substrate well, to the plurality of word lines, to the GSL line, to the SSL lines and to the bit lines for controlling operation of the memory circuit. In this structure, the circuitry is configured to drive, or to bias, the supply line and the doped substrate well with different bias conditions. Also, the controller can include circuitry configured to apply an erase bias arrangement that induces hole tunneling, a program bias arrangement, and a read bias arrangement. The controller is described below with reference to FIG. 13.

FIG. 10 shows a program bias arrangement that induces electron tunneling. In this bias arrangement, a source side bias is applied to the supply line 803 and the doped substrate well 310 (e.g. SC=0V, P substrate=0V).

In FIG. 10, the program bias arrangement can be understood with reference to the illustrated example as follows:
Select BL: 0V
Unselect BL: 3.3V
Select SSL: 3.3V
Unselect SLL: 0V
Select WL: Vpgm
Unselect WL: Vpass
GSL: 0V
N+ Source Contact (SC): 0V
P Substrate source side: 0V This program bias arrangement can represent a program pulse in a programming operation, such as an incremental step pulsed programming ISPP process, for more conventional flash memory array, where the additional source of carriers is not needed.

FIG. 11 shows an erase bias arrangement that induces hole tunneling. In this erase bias arrangement, the substrate connector 290 can provide a hole current path from the doped substrate well 310 to a series arrangement of a plurality of memory cells (e.g. 840, 842, 845, 847). A source side bias is applied to the doped substrate well 310 (e.g. P substrate=12~20V) while the supply line 803 remains floating (e.g. SC=floating), so that the supply line 803 is not involved in the biasing. A deep N-well surrounding the doped substrate well can be applied the same source side bias. The erase bias arrangement can be understood with reference to the illustrated example, as follows:
All BL: Floating
All SSL: Floating or 6-8V
All WL: 0V
GSL: Floating or 6-8V
N+ Source Contact (SC): Floating
P Substrate source side: 12~20V
Deep N-well surrounding P Substrate: 12~20V In this erase operation, the doped substrate well can provide a source of holes for the hole tunneling erase. Also, gate induced drain leakage GIDL in the GSL switches can contribute holes to the active strips. In this erase operation, a plurality of word lines coupled to a semiconductor strip including a plurality of memory cells can be biased at a non-negative voltage (e.g. 0V), thus reducing peripheral circuitry necessary for generating negative bias voltages for word lines.

Figure 13:
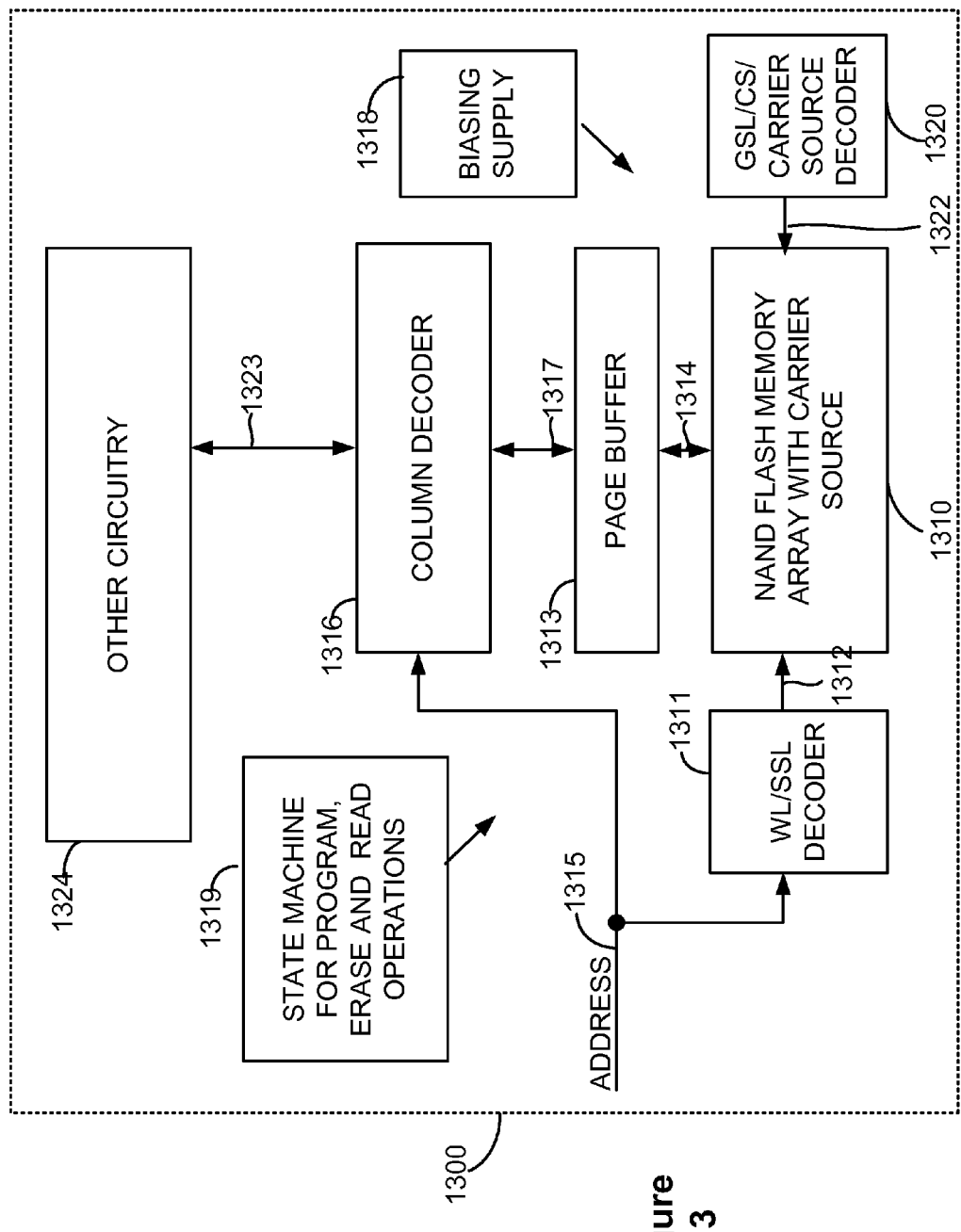
FIG. 13 is a simplified block diagram of an integrated circuit including a 3D memory including a carrier source circuit as described herein.

FIG. 12 illustrates a read bias arrangement. In this read bias arrangement, a source side bias is applied to the supply line 803, and the doped substrate well 310 (e.g. SC=0V, P substrate=0V). The read bias arrangement can be understood with respect to the illustrated example as follows:

Select BL: 1V
Unselect BL: 0V
Select SSL: 3.3V
Unselect SLL: 0V
Select WL: Vref
Unselect WL: Vpass
GSL: 3.3V
N+ Source contact (SC): 0V
P Substrate source side: 0V FIG. 13 is a simplified block diagram of an integrated circuit 1300 including a p-channel, NAND flash memory array 1310 which can be operated as described herein. In some embodiments, the array 1310 is a 3D memory and includes multiple levels of cells. A row decoder 1311 is coupled to a plurality of word lines 1312 arranged along rows in the memory array 1310. Column decoders in block 1316 are coupled to a set of page buffers 1313, in this example via data bus 1317. The global bit lines 1314 are coupled to local bit lines (not shown) arranged along columns in the memory array 1310. Addresses are supplied on bus 1315 to column decoder (block 1316) and row decoder (block 1311). In addition, as logically represented by block 1320, the circuitry includes drivers for the supply lines 1322 so that they can be biased.

Data is supplied via the data-in line 1323 from other circuitry 1324 (including for example input/output ports) on the integrated circuit, such as a general purpose processor or special purpose application circuitry, or a combination of modules providing system-on-a-chip functionality supported by the array 1310. Data is supplied via the data-in line 1323 to input/output ports or to other data destinations internal or external to the integrated circuit 1300.

A controller, implemented in this example as a state machine 1319, provides signals to control the application of bias arrangement supply voltages generated or provided through the voltage supply or supplies in block 1318 to carry out the various operations described herein, including operations to read and write data in the array. These operations include erase, program and read. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

The controller can comprise circuitry that executes a process including biasing the carrier source structure to provide minority carriers from the doped substrate well to the series arrangement during erase operations, and biasing the word lines in the plurality of word lines at a non-negative voltage during erase operations. The controller can comprise circuitry that executes other processes including program and read operations as described herein. The memory can include a pickup contact to the doped substrate well, to which the controller is connected for biasing the doped substrate well.

A carrier source structure is described which can lead to improved erase performance in 3D memory. The carrier source structure includes a stack of source line contact pads separated by insulating layers overlying a doped substrate well. The carrier source structure has a substrate connector coupled to a doped substrate well in the integrated circuit 1300, and a set of interlayer connectors insulated from the doped substrate well.

In one embodiment, the carrier source structure is disposed in a vertical gate (VG) NAND flash. In operation, hole tunneling erase in a 3D vertical gate memory can be much different from the conventional NAND due to the thin film transistor (TFT) structure and lack of a body contact. A hole source in this case can result in improvement of the device erase.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. A memory comprising:
   a doped substrate well;
   a substrate connector coupled to the doped substrate well, and a set of interlayer connectors insulated from the doped substrate well;
   a series arrangement including a plurality of memory cells, the series arrangement coupled on a first end by a first switch to a bit line and coupled on a second end by a second switch to a source line contact pad, wherein the source line contact pad is connected to the substrate connector and to at least one of the interlayer connectors in the set of interlayer connectors;
   a supply line connected to the set of interlayer connectors;
   a plurality of word lines, word lines in the plurality coupled to corresponding memory cells in the plurality of memory cells; and
   circuitry coupled to the supply line and to the doped substrate well and configured to bias the supply line and the doped substrate well with different bias conditions.

2. The memory of claim 1, comprising a pickup contact to the doped substrate well, to which the circuitry is connected for biasing the doped substrate well.

3. The memory of claim 1, wherein the circuitry is configured to apply an erase bias arrangement that induces hole tunneling, the erase bias arrangement including a source side bias on the doped substrate well, while the supply line remains floating, and erase voltages on the plurality of word lines that induce hole tunneling.

4. The memory of claim 3, wherein the erase voltages on the plurality of word lines is non-negative.

5. The memory of claim 1, wherein the circuitry is configured to apply a program bias arrangement that induces electron tunneling, the program bias arrangement including a source side bias on the supply line and the doped substrate well, and program voltages on the plurality of word lines that induce electron tunneling.

6. The memory of claim 1, wherein the doped substrate well includes p-type doping, and the set of interlayer connectors includes n-type doping.

7. The memory of claim 1, wherein the series arrangement is a NAND string, the memory including at least one additional NAND string coupled to the substrate connector.

8. The memory of claim 1, wherein the plurality of memory cells comprises thin film transistor cells arranged on a single semiconductor strip which overlies the doped substrate well.

9. The memory of claim 1, wherein the plurality of memory cells comprises thin film, vertical gate cells.

10. A memory comprising:
   a 3D array including a plurality of levels, each level including a pad and a plurality of strips of semiconductor material extending from the pad;
   a doped substrate well;
   a substrate connector coupled to the doped substrate well, and a set of interlayer connectors insulated from the doped substrate well, contacting one or more strips on an end distal of the pads in the plurality of levels;
   a supply line connected to the set of interlayer connectors;
   a plurality of word lines coupled to the plurality of strips in the plurality of levels;
   charge-trapping, data storage elements between the word lines in the plurality of word lines and the strips of semiconductor material, whereby memory cells are disposed at cross-points of the strips and the word lines; and
   circuitry coupled to the supply line and to the doped substrate well and configured to bias the supply line and the doped substrate well with different bias conditions.

11. The memory of claim 10, comprising a pickup contact to the doped substrate well, to which the circuitry is connected for biasing the doped substrate well.

12. The memory of claim 10, wherein the circuitry is configured to apply an erase bias arrangement that induces hole tunneling, the erase bias arrangement including a source side bias on the doped substrate well, while the supply line remains floating, and erase voltages on the plurality of word lines that induce hole tunneling.

13. The memory of claim 12, wherein the erase voltages on the plurality of word lines is non-negative.

14. The memory of claim 10, wherein the circuitry is configured to apply a program bias arrangement that induces electron tunneling, the program bias arrangement including a source side bias on the supply line and the doped substrate well, and program voltages on the plurality of word lines that induce electron tunneling.

15. The memory of claim 10, including a plurality of first select lines coupled to respective stacks of strips in the plurality of strips proximal to the pads, and a second select line overlying the plurality of strips between the substrate connector and the plurality of word lines.

16. The memory of claim 10, wherein the doped substrate well includes p-type doping, and the set of interlayer connectors includes n-type doping.

17. The memory of claim 10, wherein the plurality of levels overlies the doped substrate well.

18. The memory of claim 10, wherein the plurality of memory cells comprises thin film, vertical gate cells.

* * * * *